United States Patent
Jaze et al.

(10) Patent No.: US 8,243,470 B2
(45) Date of Patent: Aug. 14, 2012

(54) FERRITE INDUCTORS INTEGRATED WITHIN TOP-MOUNTED INPUT/OUTPUT CABLE PORT ASSEMBLY OF AN ELECTRONICS RACK

(75) Inventors: Alma Jaze, Astoria, NY (US); Alan H. Knight, Cary, NC (US); John M. Skillman, New Paltz, NY (US); Kwok M. Soohoo, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/750,740

(22) Filed: Mar. 31, 2010

(65) Prior Publication Data

US 2011/0242788 A1    Oct. 6, 2011

(51) Int. Cl.
  *H05K 9/00*  (2006.01)
(52) U.S. Cl. .......... 361/818; 361/800; 361/816; 174/32; 174/350; 439/607.15; 439/44
(58) Field of Classification Search .................. 361/800, 361/816, 818, 826; 174/32, 350, 377; 439/607.15, 439/607.44, 607.49
See application file for complete search history.

(56) References Cited

U.S. PATENT DOCUMENTS

| | | | | |
|---|---|---|---|---|
| 3,744,001 | A | * | 7/1973 | Schor ........................ 439/607.01 |
| 4,764,422 | A | | 8/1988 | Hill et al. |
| 4,992,060 | A | * | 2/1991 | Meyer ...................... 439/620.21 |
| 5,708,568 | A | | 1/1998 | Ostendorf |
| 5,770,984 | A | | 6/1998 | Raleigh et al. |
| 6,058,025 | A | | 5/2000 | Ecker et al. |
| 6,142,829 | A | * | 11/2000 | O'Groske et al. ....... 439/620.08 |
| 6,147,299 | A | | 11/2000 | Ferguson |
| 6,147,928 | A | * | 11/2000 | Onizuka et al. .................. 367/43 |
| 6,157,547 | A | | 12/2000 | Brown et al. |
| 6,249,205 | B1 | | 6/2001 | Meadors et al. |

(Continued)

FOREIGN PATENT DOCUMENTS

GB    2251733 A    7/1992

(Continued)

OTHER PUBLICATIONS

Urabe et al., "A Method for Measuring the Characteristics of an EMI Suppression Ferrite Core", IEEE Transactions on Electromagnetic Compatibility, vol. 48, No. 4, pp. 774-780 (Nov. 2006).

(Continued)

*Primary Examiner* — Dameon Levi
(74) *Attorney, Agent, or Firm* — Dennis Jung, Esq.; Kevin P. Radigan, Esq.; Heslin Rothenberg Farle & Mesiti P.C.

(57) ABSTRACT

An input/output cable port assembly and electromagnetic interference attenuation method are provided. The cable port assembly includes a cable port structure mounted to an electronics rack with an opening for input/output cables to pass therethrough, and multiple bottom ferrite inductor portions and multiple top ferrite inductor portions. The bottom and top ferrite inductor portions include first and second surfaces, respectively. The inductor portions are configured to be stacked within the cable port structure with their first and second surfaces in opposing relation to define at least one ferrite inductor with a central opening defined by the first and second surfaces for input/output cable(s) of the electronics rack to pass. The ferrite inductor attenuates electromagnetic interference resulting from transient or steady state current on the cable(s) passing therethrough.

18 Claims, 13 Drawing Sheets

U.S. PATENT DOCUMENTS

| | | | |
|---|---|---|---|
| 6,268,787 B1 * | 7/2001 | Onizuka | 336/92 |
| 6,346,673 B1 * | 2/2002 | Onizuka | 174/36 |
| 6,469,244 B1 * | 10/2002 | Harrison et al. | 174/360 |
| 6,477,061 B1 | 11/2002 | Johnson | |
| 6,641,439 B2 | 11/2003 | Kim | |
| 6,667,436 B2 | 12/2003 | Takami et al. | |
| 6,885,258 B2 * | 4/2005 | Suzuki | 333/12 |
| 6,953,889 B2 | 10/2005 | Hanks | |
| 7,140,923 B2 * | 11/2006 | Karir et al. | 439/676 |
| 2006/0034026 A1 * | 2/2006 | Chiku et al. | 361/85 |
| 2007/0013470 A1 | 1/2007 | Berens et al. | |
| 2007/0190815 A1 | 8/2007 | Sampson et al. | |
| 2011/0242787 A1 | 10/2011 | Jaze et al. | |

FOREIGN PATENT DOCUMENTS

| | | |
|---|---|---|
| JP | 05-325690 | 12/1993 |
| JP | 05-325691 | 12/1993 |
| JP | 07-170631 | 7/1995 |
| JP | 11-260645 | 9/1999 |
| JP | 11-346085 | 12/1999 |
| JP | 2000-348826 | 12/2000 |
| JP | 2002-111256 | 4/2002 |
| JP | 2003-249778 | 9/2003 |

OTHER PUBLICATIONS

Fujiwara et al., "An Analysis of Load Effects Produced by Ferrite Core Attachment", Electronics and Communications in Japan, Part 1, vol. 80, No. 9, pp. 19-24 (1997).

Masahi et al., "Suppression Effect of Radiated Emission from Twisted Pair Wires with Ferrite Core", IEEE International Symposium on Electromagnetic Compatibility, Boston, MA, pp. 448-453 (Aug. 18, 2003-Aug. 22, 2003).

Bahri et al., "Serpent Assembly with Ferrite Core", www.ip.com, IPCOM000103295D, Sep. 1, 1990.

Anonymous, "A New EMI Shield Design to Minimize Connector/Cable EMI Emissions", www.ip.com, IPCOM000143944D, Dec. 12, 2006.

A. Jaze et al., Office Action for U.S. Appl. No. 12/750,736, filed Mar. 31, 2010 (U.S. Patent Publication No. 2011/0242787 Al), dated Feb. 2, 2012.

* cited by examiner

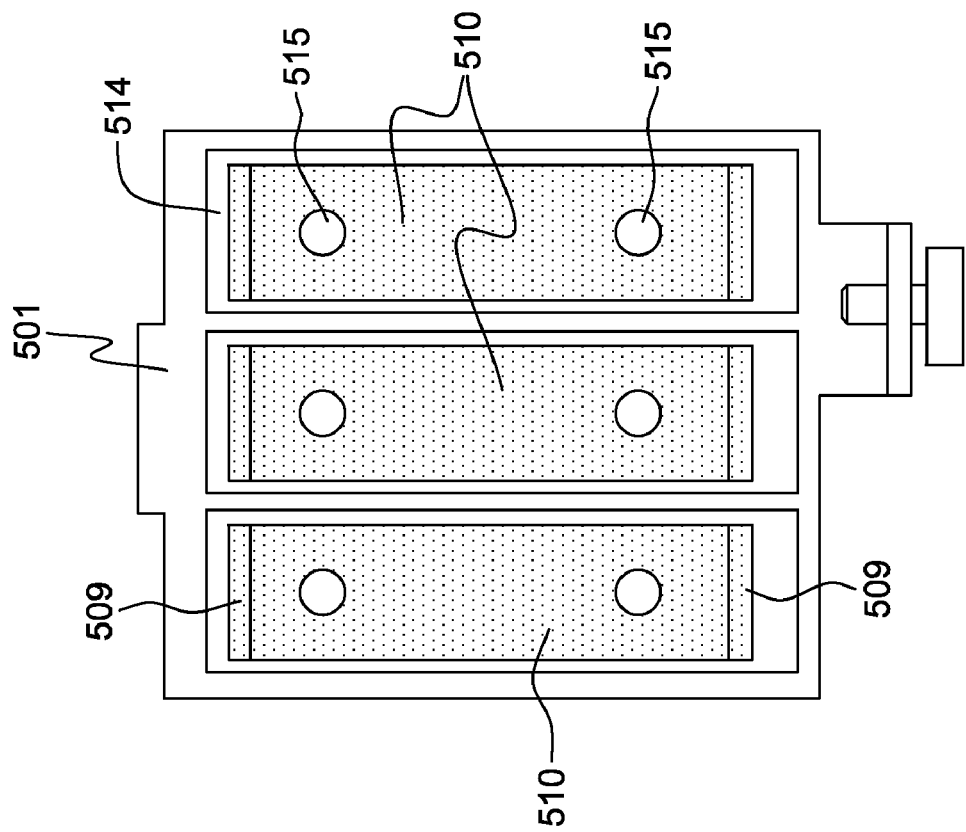
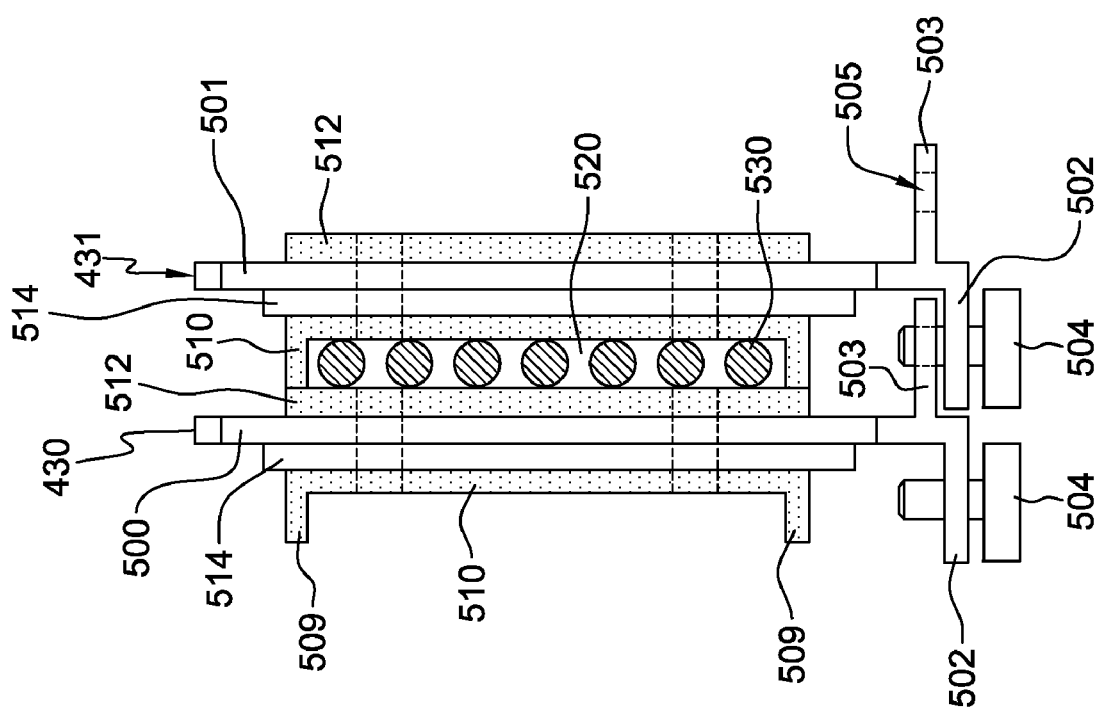
FIG. 5B
FIG. 5A

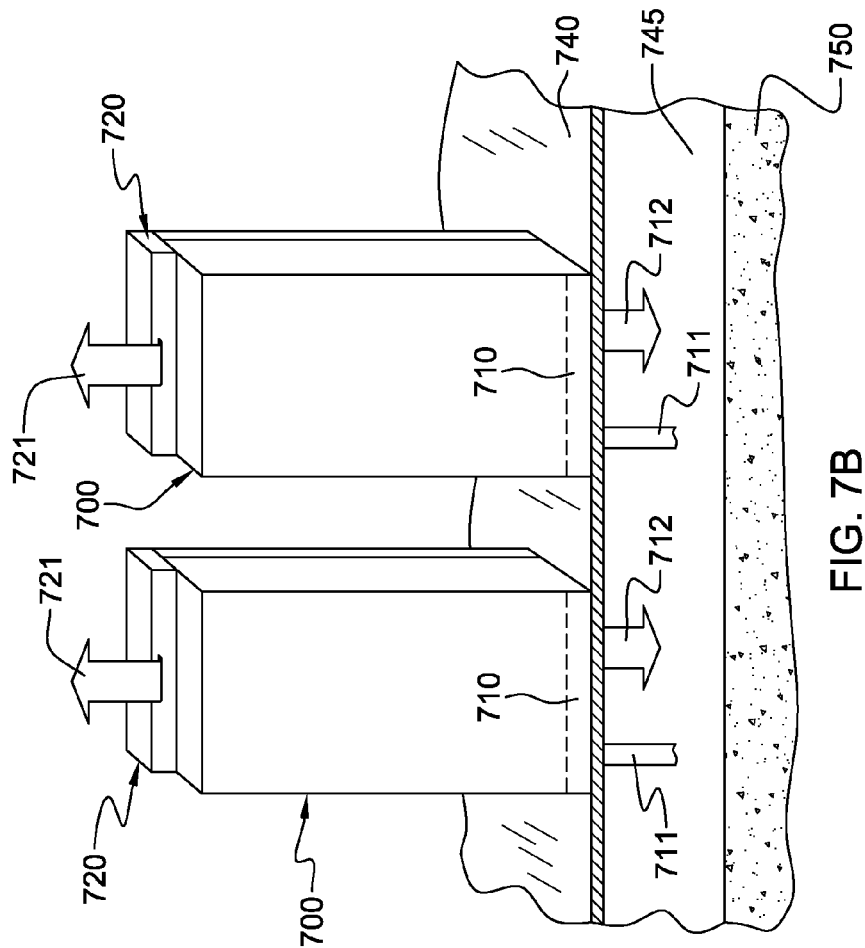
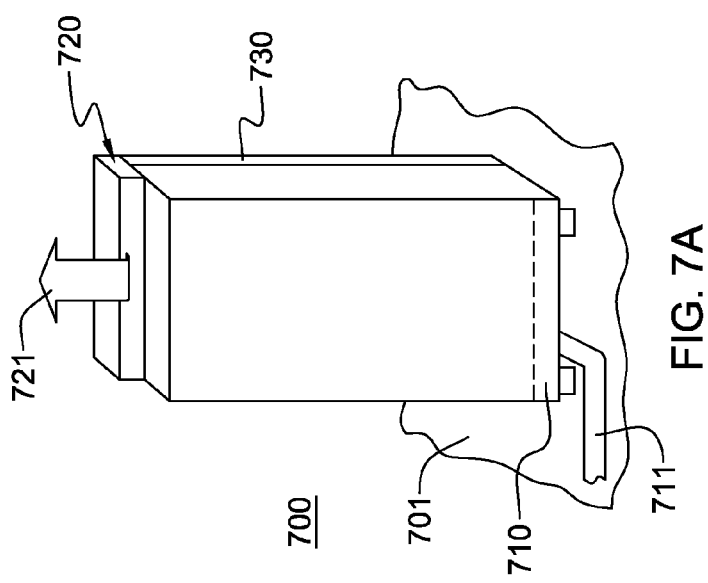
FIG. 7B
FIG. 7A

FERRITE INDUCTORS INTEGRATED WITHIN TOP-MOUNTED INPUT/OUTPUT CABLE PORT ASSEMBLY OF AN ELECTRONICS RACK

BACKGROUND

The present invention relates in general to ferrite inductors for suppressing electromagnetic interference (EMI), and more particularly, to ferrite inductors for suppressing EMI emanating from rack-mounted assemblages of individual electronics units within a data center.

A cable that carries analog signals or digital signals, has a tendency to act as an antenna, radiating energy in the form of electromagnetic radiation. This tendency depends on several factors, including the frequency of the signals and the length and the geometric layout of the cable. The electromagnetic radiation emitted by a cable increases the noise level of the electromagnetic environment. That is, it may create electromagnetic interference (EMI). It is known that one or more ferrite cores may be placed on a cable to suppress the effects of EMI. To be effective, the core or cores should allow the magnetic flux produced by current in the cable to flow through the ferrite material. The EMI suppression effect of ferrite cores is reduced if air gaps exist between the cores.

Ferrite cores are generally produced by sintering suitable materials into rigid bodies, which materials are known in the art. Such materials include, for example, MnZn for lower frequencies and NiZn for middle and upper frequencies. The sintered ferrite material is dense and brittle, and can be somewhat bulky. The use of ferrite cores to suppress EMI can therefore be challenging from an electronics packaging perspective, both at the electronics unit level, as well as at the electronics rack level.

In preassembled cable assemblies, ferrite cores are typically retained on a cable at a particular location with a plastic shrink-wrap. Cables may also be retrofit with ferrite cores by mounting the cores in plastic housings that are then clipped or clamped directly to the cable. Both of these ferrite core solutions for reducing EMI require customization of many cables, such as input/output signal cables for an electronics rack. This can result in significant engineering and inventory expenses for a large amount of cable part numbers.

BRIEF SUMMARY

In one aspect, the shortcomings of the prior art are overcome and additional advantages are provided through the provision of an input/output cable port assembly for an electronics rack. The input/output cable port assembly includes a cable port structure for the electronics rack with an opening for input/output cables to pass therethrough, and at least one bottom ferrite inductor portion and at least one top ferrite inductor portion. The at least one bottom ferrite inductor portion is disposed within the opening of the cable port structure, and includes a first surface, and the at least one top ferrite inductor portion is disposed within the opening of the cable port structure, and includes a second surface. The at least one bottom ferrite inductor portion and the at least one top ferrite inductor portion are stacked within the cable port structure with the first and second surfaces thereof in opposing relation to define at least one ferrite inductor with a central opening defined by the opposing first and second surfaces. The central opening(s) are sized for at least one input/output cable of the electronics rack to pass therethrough, wherein the at least one ferrite inductor attenuates electromagnetic interference resulting from transient or steady state current on the at least one input/output cable passing therethrough.

In another aspect, an electronics system is provided which includes an electronics rack. The electronics rack includes a rack frame, at least one electronics subsystem disposed within the electronics rack and supported by the rack frame, and an input/output cable port assembly within the electronics rack through which at least a portion of the input/output cables of the electronics rack pass. The input/output cable port assembly includes a cable port structure, mounted to an upper portion of the rack frame, with an opening for input/output cables to pass therethrough, and at least one bottom ferrite inductor portion and at least one top ferrite inductor portion. The at least one bottom ferrite inductor portion is disposed within the opening in the cable port structure and includes a first surface, and the at least one top ferrite inductor portion is also disposed within an opening of the cable port structure, and includes a second surface. The at least one bottom and top ferrite inductor portions are stacked within the cable port structure with the first and second surfaces thereof in opposing relation to define at least one ferrite inductor, each ferrite inductor including a central opening defined by the opposing first and second surfaces. The central opening(s) are sized for at least one input/output cable of the electronics rack to pass therethrough, wherein the at least one ferrite inductor attenuates electromagnetic interference resulting from transient or steady state current on the at least one input/output cable passing therethrough.

In a further aspect, a method of attenuating electromagnetic interference resulting from transient or steady state current on at least one input/output cable exiting an electronics rack is provided. The method includes: mounting a cable port structure to the electronics rack, the cable port structure including an opening for input/output cables to pass therethrough; providing at least one bottom ferrite inductor portion within the opening of the cable port structure, the at least one bottom ferrite inductor portion comprising a first surface; disposing the at least one input/output cable over the first surface of the at least one bottom ferrite inductor portion; and positioning at least one top ferrite inductor portion over the at least one bottom ferrite inductor portion within the opening of the cable port structure, the at least one top ferrite inductor portion comprising a second surface, and the positioning comprising disposing the at least one top ferrite inductor portion over the at least one bottom ferrite inductor portion within the first and second surfaces thereof in opposing relation to define at least one ferrite inductor, each with a central opening defined by the opposing first and second surfaces, the central opening(s) being sized for the at least one input/output cable to pass therethrough, wherein the at least one ferrite inductor attenuates electromagnetic interference resulting from transient or steady state current on the at least one input/output cable passing therethrough.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5A is a plan view of one embodiment of two adjoining partitions of the input/output cable port assembly of FIG. 4, wherein the two adjoining partitions are shown interlocked, and illustrating a plurality of input/output cables passing through the ferrite inductor defined between the adjoining partitions, in accordance with an aspect of the present invention;

FIG. 5B is an elevational view of one embodiment of U-shaped ferrite inductor portions on one side of one partition plate shown in FIG. 5A, in accordance with an aspect of the present invention;

FIG. 7A depicts one embodiment of an electronics rack with a top-mounted input/output cable port assembly though which at least a portion of the input/output cables of the electronics rack pass, in accordance with an aspect of the present invention;

FIG. 7B depicts multiple electronics racks, each with a top-mounted input/output cable port assembly, and a bottom-mounted input/output cable port assembly such as depicted (for example) in FIGS. 4-6B, in accordance with an aspect of the present invention;

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. "Cable port structure" refers to any frame, rack, bracket, housing, etc., defining an opening through which input/output cables of the electronics rack are to pass. In a bottom-mounted input/output cable port assembly embodiment such as disclosed herein, the cable port structure is disposed at the bottom or at a lower region of the electronics rack, which is particularly useful in a non-raised floor data center installation. In a top-mounted input/output cable port assembly embodiment such as disclosed herein, the cable port structure is disposed at the top or at an upper region of the electronics rack, which is particularly useful in exiting input/output cables of the electronics rack to a space above the electronics rack. As used herein, the phrase "data center" refers to a computer room installation which contains one or more electronics racks to be cooled. As a specific example, a data center may be designed to contain one or more rows of rack-mounted computing units, such as server units.

Reference is made below to the drawings, which are not drawn to scale to facilitate understanding of the invention, wherein the same reference numbers used throughout different figures designate the same or similar components.

Figure 1:
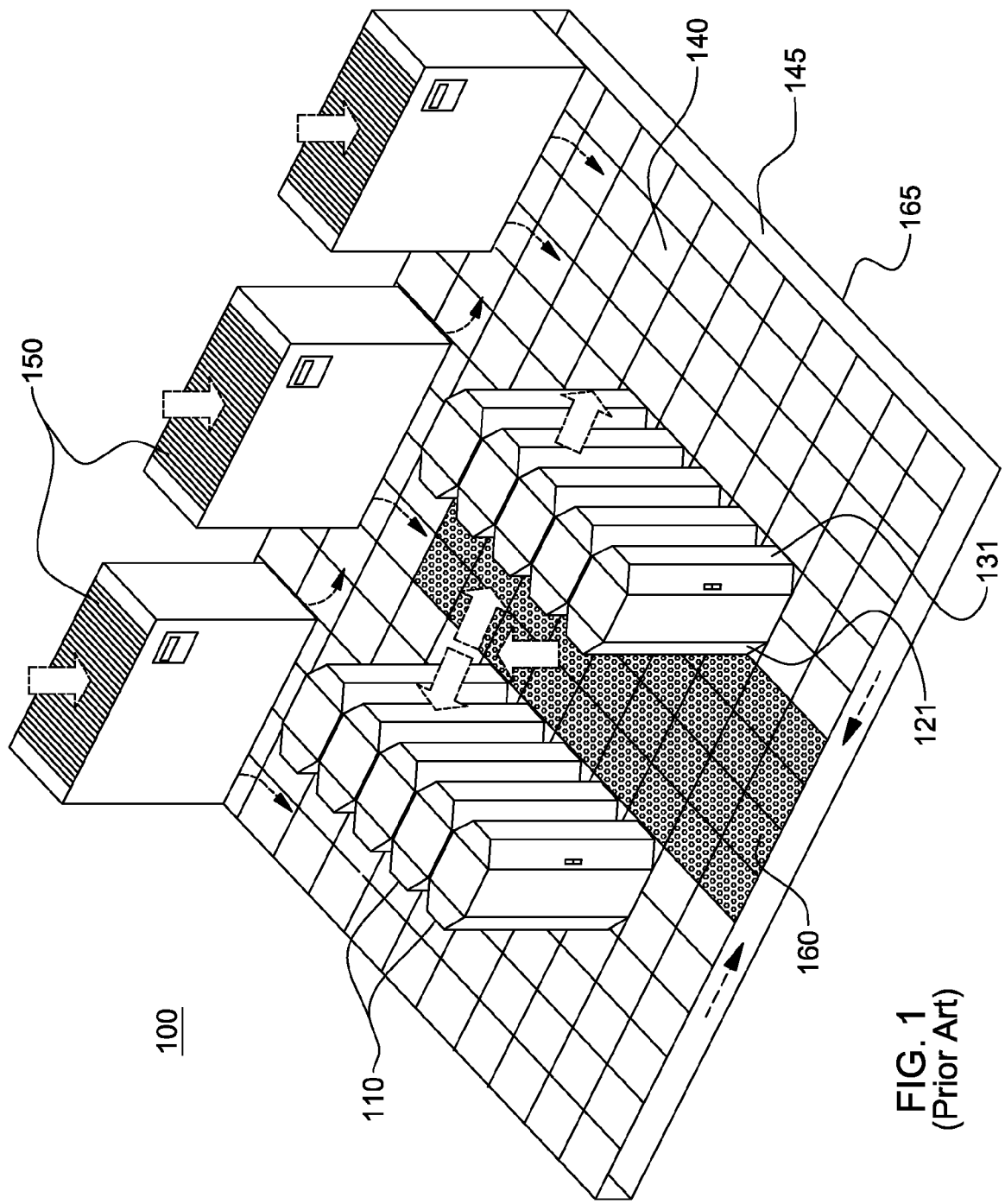
FIG. 1 depicts one embodiment of a conventional raised floor layout of a data center.

As shown in FIG. 1, in a raised floor layout of a computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within data center 100. Room air is taken into each conditioned air unit 150 near an upper portion thereof. This room air comprises in part exhausted air from the "hot" air aisles of the data center disposed adjacent to air outlet sides of the electronics racks 110.

Electronics racks comprising high-end computing systems such as a System p® or System z® offered by International Business Machines Corporation (IBM®), of Armonk, N.Y., comprise configurations for both raised floor and non-raised floor installations. (IBM® System p® and System z® are registered trademarks of International Business Machines Corporation, Armonk, N.Y. Other names used herein may be registered trademarks, trademarks or product names of International Business Machines Corporation or other companies.)

Figure 2:
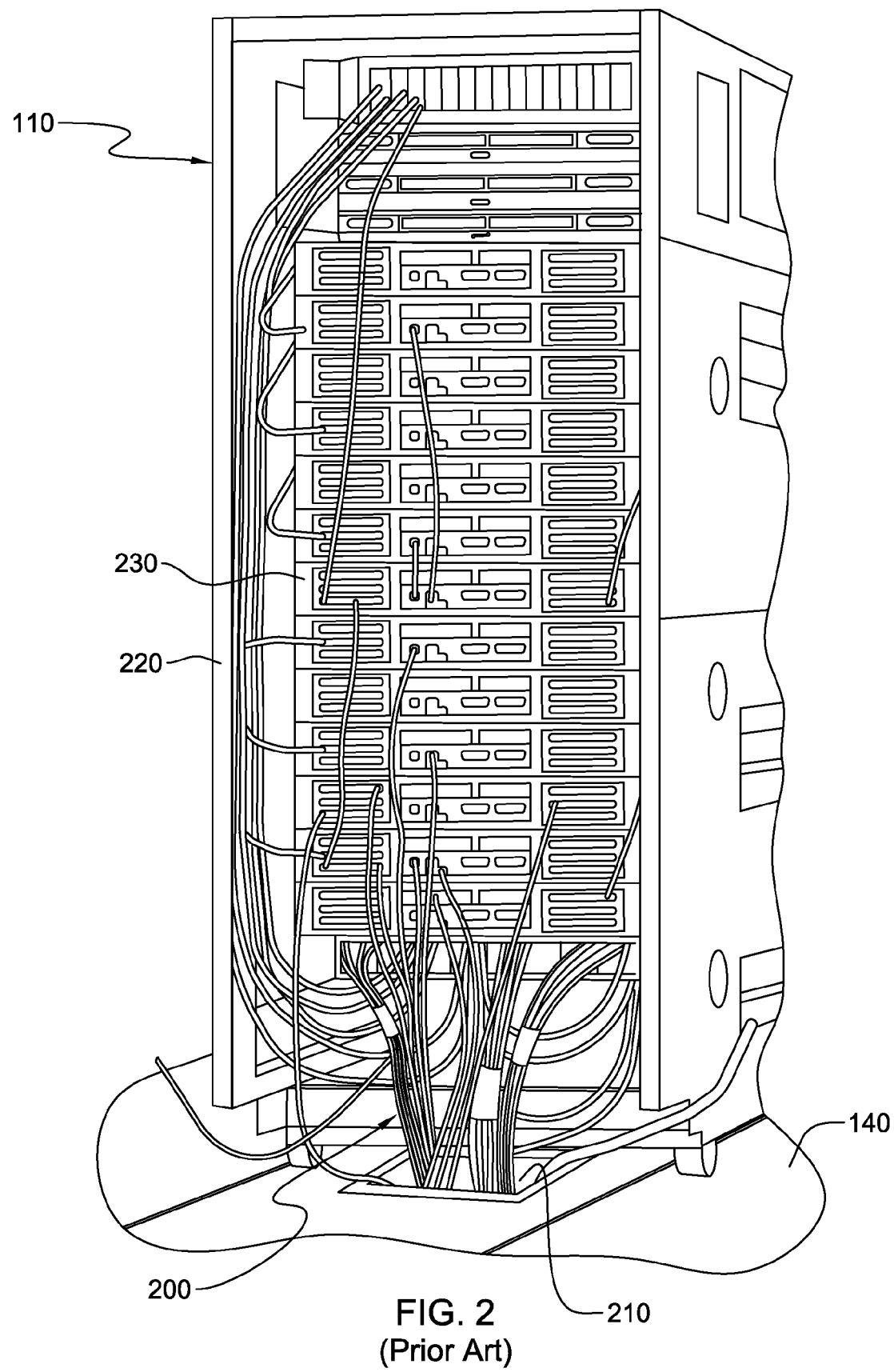
FIG. 2 is a perspective view of one embodiment of a conventional electronics rack disposed on the raised floor of a raised floor data center, and illustrating input/output cables extending into the space below the raised floor.

FIG. 2 illustrates a raised floor 140 installation of an electronics rack 110 wherein a plurality of input/output cables 200, such as various Ethernet cables, extend into an opening 210 in raised floor 140. Electronics rack 110 includes a rack frame 220 which supports a plurality of electronics subsystems 230 from and to which the plurality of cables 200 extend, at least some of which pass through opening 210 in raised floor 140 for coupling, for example, to one or more other electronics racks or electronics equipment within the data center. In one conventional approach, input/output cabling 200 continues under raised floor 140 through a rectangular structure with a conductive gasket that shorts out the structure and forms a capacitive coupling with the metal of the raised floor so that energy is blocked from escaping. However, in a non-raised floor environment, an alternate approach is needed for attenuating electromagnetic interference radiating from the input/output cables.

Figure 3:
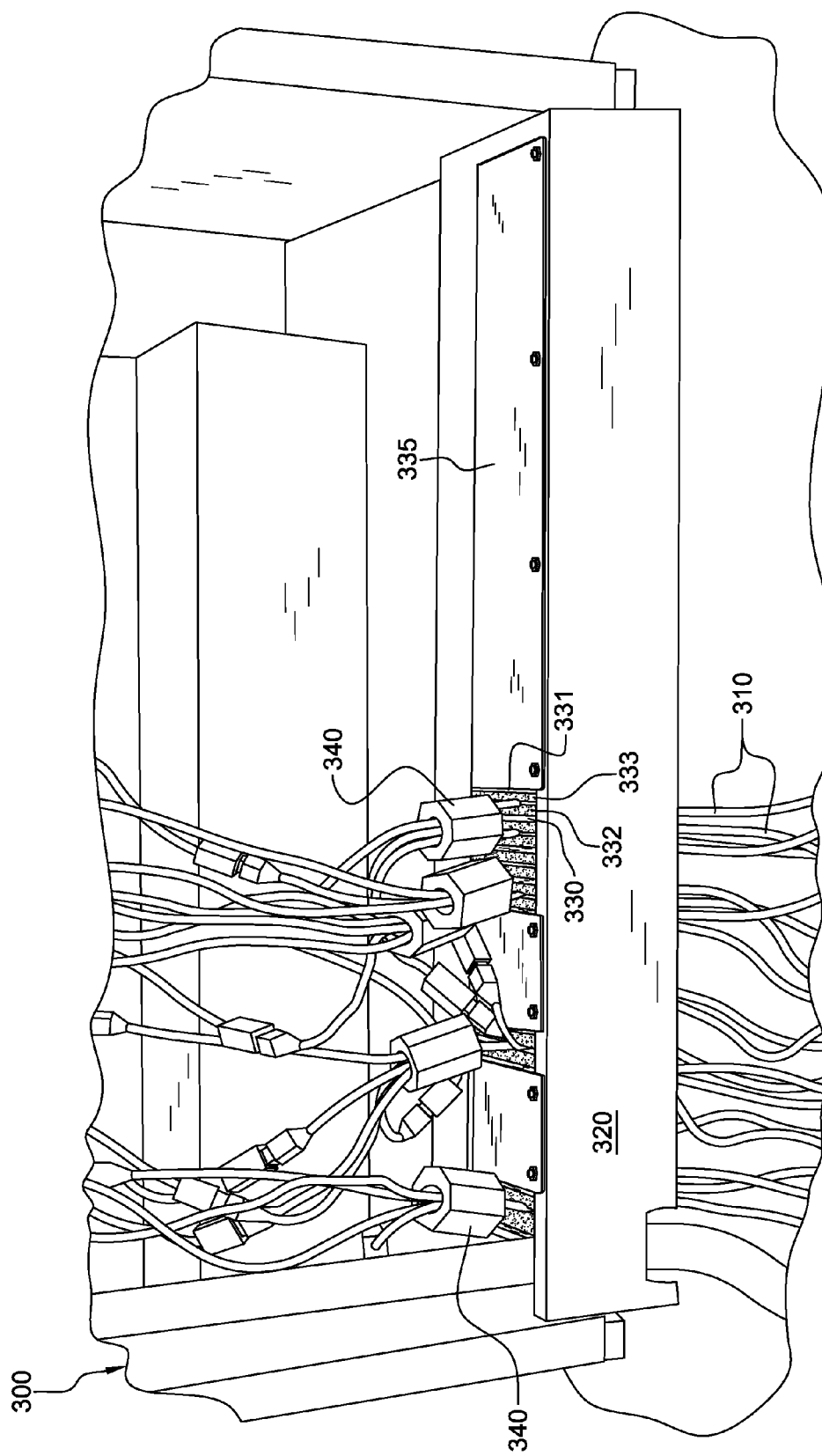
FIG. 3 is a partial perspective view of an alternate embodiment of an electronics rack with a tailgate structure through which input/output cables pass, for facilitating use of the electronics rack in a non-raised floor data center.

FIG. 3 illustrates one embodiment of a lower portion of an electronics rack 300, with an access panel removed and showing a plurality of cables 310 extending through a tailgate structure 320, wherein a plurality of adjoining, interlocked partitions 330, 331 are employed with opposing compressible surfaces 332, 333 which engage one or more input/output cables 310 passing therethrough to provide relief. As illustrated, horizontally-coupled plates 335 can be used to further reduce the size of the cable opening within tailgate structure 320 to limit radiation of electromagnetic interference from the inside of the electronics rack into the data center.

Due to the large amount of input/output cables, which are typically copper-based cables, the non-raised floor installation of electronics rack with exposed input/output cables has more difficulty meeting national and international radiated electromagnetic interference emission limits.

In the illustrated embodiment of FIG. 3, ferrite cores or radio frequency (RF) chokes 340 are shown applied to the input/output cables in the interior of the electronics rack adjacent to tailgate structure 320 to reduce radiated electromagnetic interference emissions. These ferrite cores 340 are disposed before the input/output cables exit the electronics rack and may be in addition to other ferrite cores or RF chokes within the electronics rack used to reduce radiated EMI emissions at different locations within the rack. Note that application of ferrite cores 340 to the input/output cables before leaving through the tailgate structure requires the relative core location to be different for each length of input/output cable. Further, the cables may be differently rated cables, such as differently rated Ethernet cables, each with a length dependent on where the cable is to extend. The ferrite cores 340 are considered loose ferrite cores since they require installation at the customer site. In an alternate implementation, the ferrite cores could be permanently integrated with the cables via plastic molding, or some other permanent means. However, this would result in significant engineering and inventory expenses resulting from the need to produce and/or maintain a large number of cable parts.

For example, in order to satisfy all national and international standards, including the Taiwan Bureau of Standards and Meteorology Inspection (BSMI), many part numbers of the same input/output cable would be required since each one would have a ferrite core installed at a different length from the end-adapter coupled within the electronics rack. In other words, each input/output cable would need to be customized. Disclosed herein are alternative approaches which incorporate ferrite inductor designs into an input/output cable port assembly.

Described below are partitions for a bottom-mounted input/output cable port assembly of an electronics rack between which at least a portion of the input/output cables of the electronics rack pass. This input/output cable port assembly includes a cable port structure for the electronics rack with an opening through which input/output cables pass, and is configured to accommodate multiple partitions, which facilitate, in part, breaking up of the relatively large cable port opening to control electromagnetic interference emissions from the rack unit. In one implementation, the input/output cable port assembly disclosed herein is disposed at or near the bottom of the electronics rack frame, for example, at one or both of the air inlet side and air outlet side of the electronics rack. At least two adjoining partitions of the input/output cable port assembly are fitted with one or more first ferrite inductor portions and/or one or more second ferrite inductor portions, which when the partitions are disposed adjacent to each other as adjoining partitions within the cable port structure, allow the first ferrite inductor portions and second ferrite inductor portions to mate and define a ferrite inductor with a central opening sized to allow one or more input/output cables of the electronics rack to pass therethrough. The ferrite inductor is configured to attenuate electromagnetic interference resulting from transient current on the one or more cables passing through the central opening of the ferrite inductor defined by the adjoining partitions of the input/output cable port assembly.

The adjoining partitions may be identical partitions, with the different ferrite inductor portions disposed on opposite sides of a partition plate, and may exclusively be employed within the input/output cable port assembly, or may be employed in combination with the relief partitions depicted in FIG. 3, which are configured and sized to compressibly hold input/output cables passing therethrough. By way of example, upper opposing portions of adjoining partitions may have ferrite inductor portions such as described herein disposed in opposing relation to encircle the input/output cables passing therethrough, while lower opposing portions of the same adjoining partitions may have a rubber or other compressible material spaced to compressibly engage the input/output cables passing therebetween and thereby hold the cables fixed. Advantageously, by providing ferrite inductor portions configured to mate and encircle one or more input/output cables, the need to customize input/output cables with ferrite cores or RF chokes is eliminated. In addition, multiple ferrite inductors with different ranges of suppression frequencies can be implemented by adjoining partitions as described herein below, thus yielding improved efficiency and flexibility in suppressing transient current on input/output cables passing through the ferrite inductor(s).

Referring collectively to FIGS. 4, 5A-5C, one embodiment of an input/output cable port assembly 420 is depicted for an electronics rack 400 through which at least a portion of the input/output cables 410 of the electronics rack pass. The input/output cables 410 are coupled via connectors 401 to internal rack cables (by way of example only) in FIG. 4.

Figure 4:
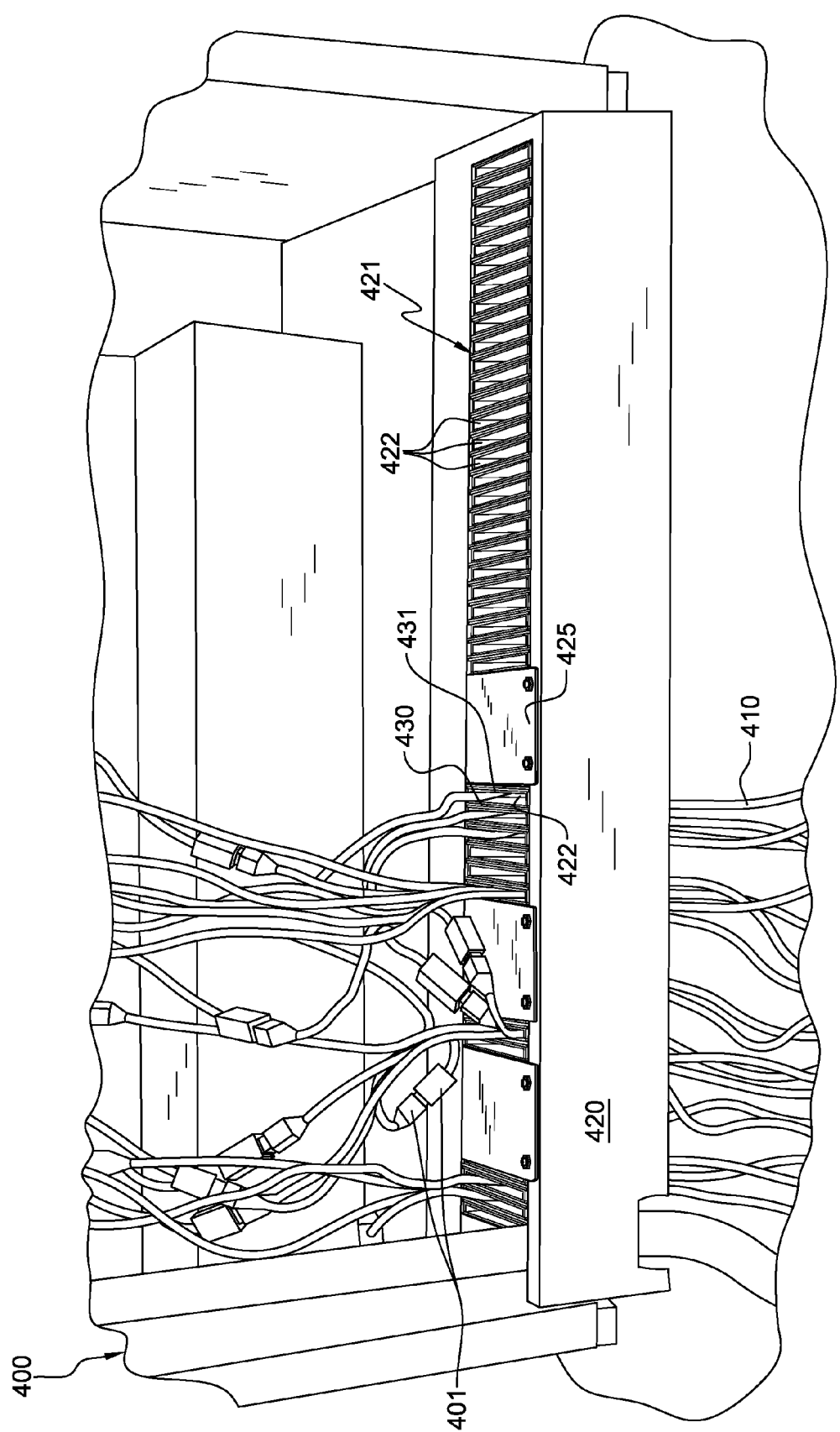
FIG. 4 is a partial perspective view of another embodiment of an electronics rack with an input/output cable port assembly through which at least a portion of the input/output cables of the electronics rack pass, in accordance with an aspect of the present invention.

The input/output cable port assembly 420 is shown to include a cable port structure 421 disposed within the electronics rack and having an opening 422 through which input/output cables 410 pass. As noted, the cable port structure can be disposed on one side of the electronics rack, or multiple sides of the electronics rack, as needed by a particular electronics system implementation. In the illustrated example of FIG. 4, two adjoining partitions 430, 431 are referenced of the multiple illustrated partitions which function to reduce the cable port opening 422 into smaller openings, and allow for the passage of the input/output cables from the electronics rack. Note also with respect to FIG. 4, that the leftmost and rightmost partitions in the cable port structure need only comprise ferrite inductor portions on one side to complete a ferrite inductor through which input/output cables may pass. In FIG. 4, mating pairs of partitions, referred herein to as adjoining partitions, are illustrated, with the partitions being employed in defining the adjacent sets of adjoining partitions.

Referring to the plan view of FIG. 5A, each partition 430, 431 of the two adjoining partitions (referenced in FIG. 4) is shown to comprise a partition plate 500, 501, which may comprise, in one embodiment, a metal partition plate. Partition plates 500, 501 may be used with other (e.g., horizontal) plates 425 (see FIG. 4) to break up the relatively large cable port opening into smaller openings, which allow the input/output cables to exit, while minimizing EMI emissions from the electronics rack. Each partition plate 500, 501 is shown to include flanges 502, 503, with flange 502 accommodating a spring-biased pin 504 and flange 503 comprising an opening 505 configured to receive spring-biased pin 504 of an adjoining partition such that the adjoining partitions interlock (as illustrated in FIG. 5A) with the compressible pin 504 of partition 431 shown engaging opening 505 in partition 430.

In addition to partition plate 500, 501, each partition 430, 431 includes one or more U-shaped ferrite inductor portions 510 on a first side thereof and one or more flat ferrite inductor portions 512 on a second side thereof. Compressible elastomer layers 514 are disposed in the example of FIG. 5A between the one or more U-shaped ferrite inductor portions 510 and the respective partition plates 500, 501 of partitions 430, 431. The compressible elastomer layers, which could alternatively, or even additionally, be disposed between the flat ferrite inductor portions 512 and the respective partition plates 500, 501, are a compressible resilient elastomer, which is provided to take up any mechanical slot tolerance between the adjoining partitions (coupled to the cable port structure) by applying pressure to one or both of the opposing ferrite inductor portions of the partitions to complete the ferrite inductor without any gap between the opposing portions. The resultant ferrite inductor is illustrated in the plan view of FIG. 5A as having, in one embodiment, a rectangular-shaped central opening 520. Depending on the configuration of the ferrite inductor portions, however, other central opening configurations could be provided. In the illustrated example, a plurality of input/output cables 530 are shown extending through central opening 520 in the ferrite inductor defined between adjoining partitions 430, 431.

FIG. 5B is an elevational view of the one side of partition 431 in opposing relation with partition 430 in FIG. 4. In FIG. 5B, three U-shaped ferrite inductor portions 510 are illustrated, each coupled via respective mechanical fasteners 515 (e.g., nylon fasteners) across compressible elastomer layers 514 to the partition plate 501. In the illustrated embodiment, the use of multiple U-shaped ferrite inductor portions 510 advantageously allows for different ferrite inductor portions of the partition to have different ranges of suppression frequencies by tailoring the respective compositions of the ferrite inductor portions. That is, the three pairs of opposing ferrite inductor portions 510, 512 illustrated in FIGS. 5B & 5C may each comprise different ferrite permeability materials to respectively suppress low, middle and high frequencies.

Figure 5D:
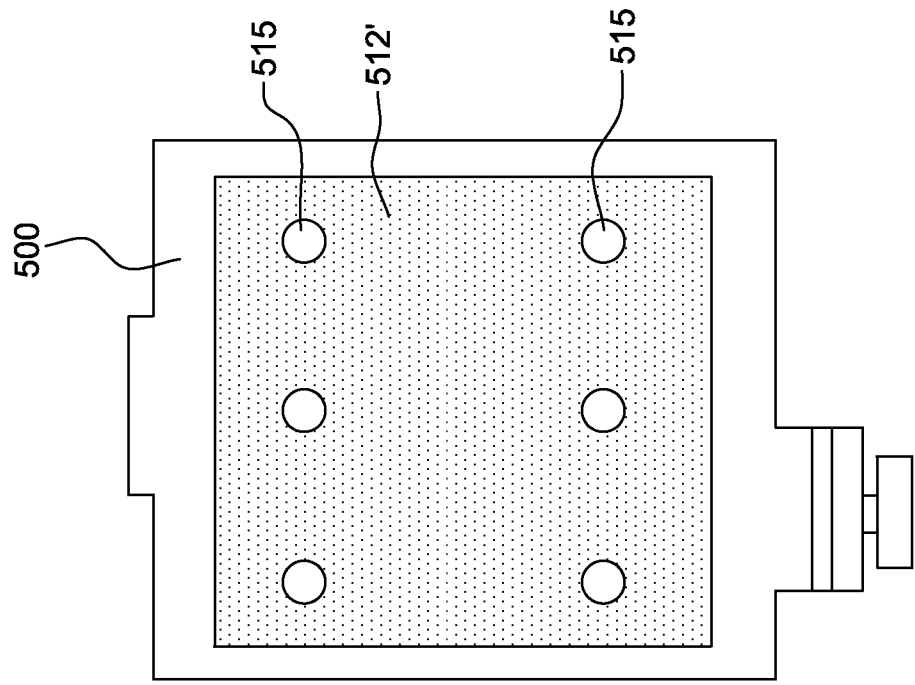
FIG. 5D is an elevational view of an alternate embodiment of a single flat ferrite inductor portion, which may replace the multiple flat ferrite inductor portions of FIG. 5C, in accordance with an aspect of the present invention.
Figure 5C:
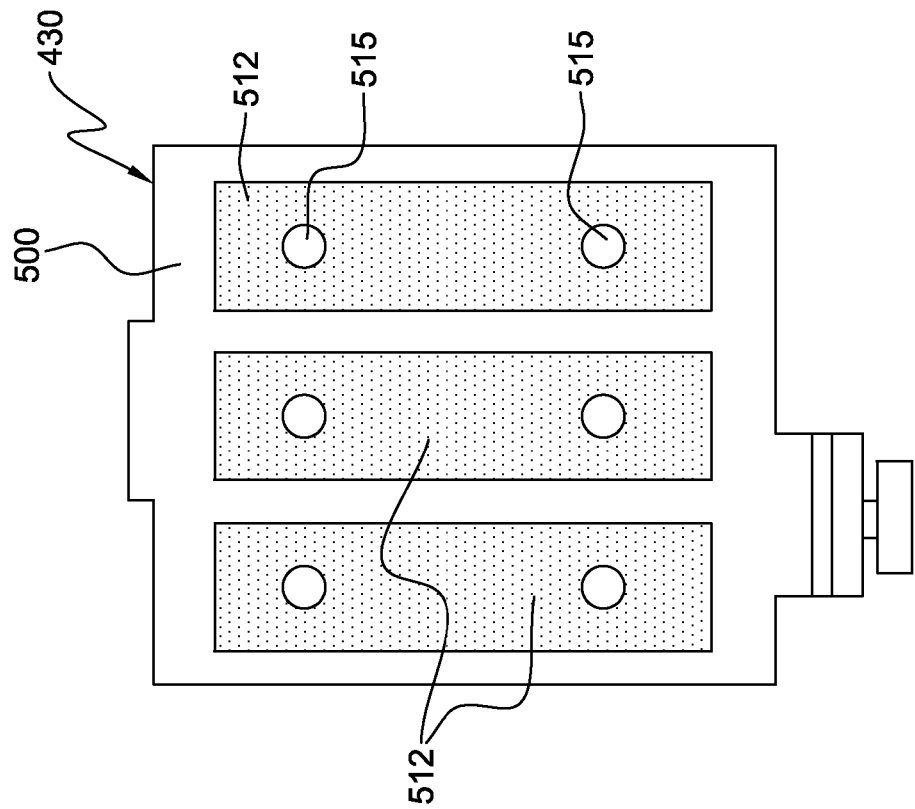
FIG. 5C is an elevational view of one embodiment of flat ferrite inductor portions on one side of the other partition plate shown in FIG. 5A, illustrating flat ferrite inductor portions sized and configured to align to respective U-shaped ferrite inductor portions of the adjoining partition, in accordance with an aspect of the present invention.

As illustrated in FIG. 5C, corresponding flat (e.g., I-shaped) ferrite inductor portions may be provided on the opposing side of the partition plate 500 of partition 430 of the adjoining partitions 430, 431 shown in FIG. 4. In one embodiment, each partition is identical, which allows for a sequence of more than two adjoining partitions to be operatively positioned and interlocked within the input/output cable port assembly, as needed. In this manner, a large number of input/output cables can be accommodated within the illustrated input/output cable port assembly of FIG. 4. Note that the projecting arms 509 of the U-shaped ferrite inductor portions 510 illustrated in FIGS. 5A & 5B are sized to allow for input/output cables 530 to extend through the central opening 520 of the ferrite inductor resulting from the mating of the U-shaped ferrite inductor portions 510 and flat ferrite inductor portions 512 on the adjoining, opposing sides of the partitions. If desired, these projecting arms 509 could be sized so that when two adjoining partitions are interlocked in operative position (as illustrated in FIG. 5A), the cables frictionally are engaged by the opposing ferrite inductor portions. This frictional engagement would limit the need for any further engagement of the input/output cables to hold the cables in fixed position relative to the electronics rack.

FIG. 5D depicts an alternate embodiment of one side of a partition wherein a single flat ferrite inductor portion 515' is attached to the partition plate 500 via mechanical fasteners 515. In one embodiment, the mechanical fasteners may be recessed within the ferrite inductor portions on opposite sides of the partition so as not to extend beyond the ferrite inductor portions, and thereby otherwise limit placement of input/output cables within the central opening(s) defined between two adjoining, interlocked partitions of the input/output cable port assembly.

Figure 6A:
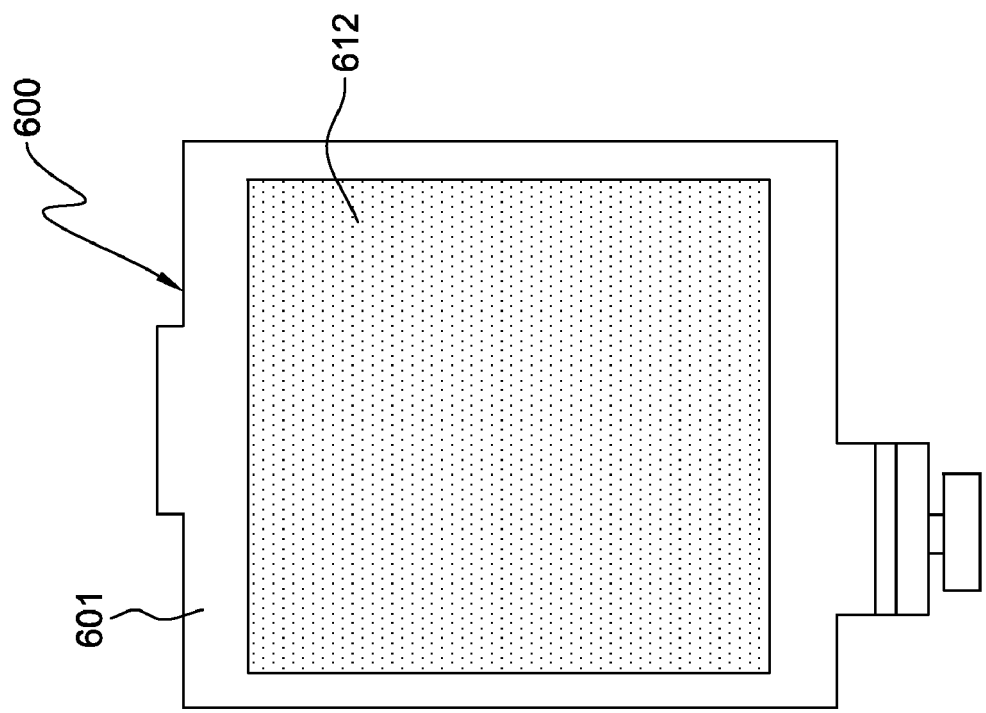
FIG. 6A is an elevational view of an alternate embodiment of a single U-shaped ferrite inductor portion on one side of a partition plate, replacing the multiple U-shaped ferrite inductor portions in the embodiment of FIG. 5B, and attached to the partition plate via an adhesive, in accordance with an aspect of the present invention.
Figure 6B:
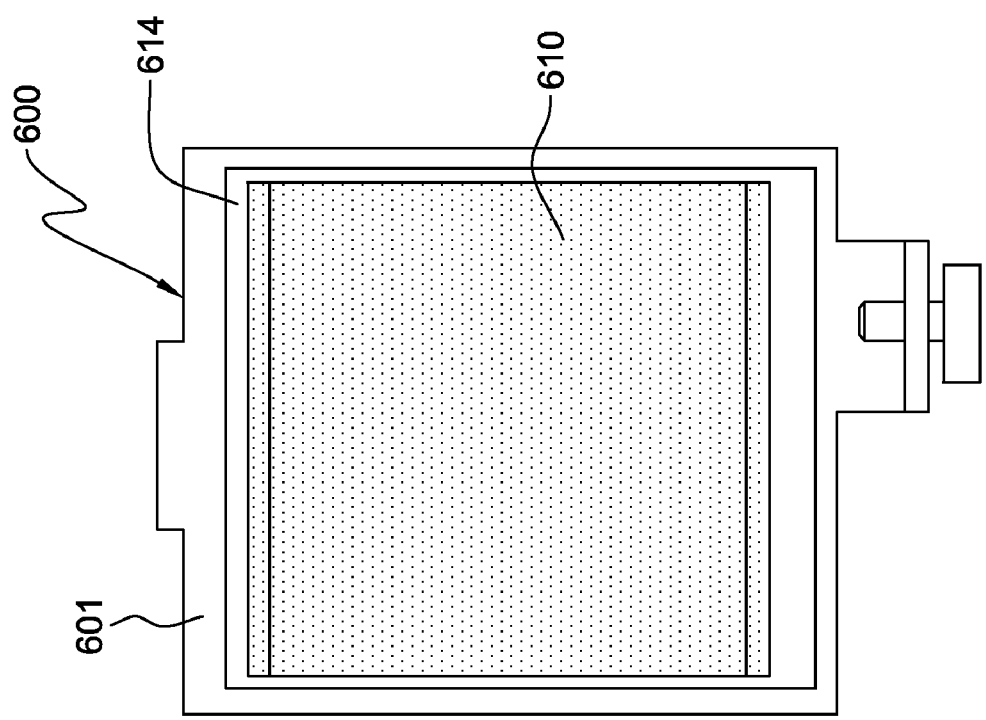
FIG. 6B is an elevational view of an alternate embodiment of the flat ferrite inductor portion attached to the partition plate shown in FIG. 5D, wherein the inductor portion is attached to the partition plate via an adhesive, in accordance with an aspect of the present invention.

FIGS. 6A & 6B depict a further alternate implementation of a partition 600, in accordance with an aspect of the present invention. In this implementation, partition 600 comprises a first side, shown in FIG. 6A, wherein a single U-shaped ferrite inductor portion 610 is illustrated as being mounted to a partition plate 601 across a compressible elastomeric material 614, and in FIG. 6B, a single flat ferrite inductor portion 612 is shown on the opposite side of partition 600 mounted to partition plate 601. In these figures, no mechanical fasteners are illustrated, rather an adhesive material is employed between the respective components of the partition.

As an alternative approach, disclosed below is a top-mounted input/output cable port assembly for an electronics rack, which may be employed with or without the above-described bottom-mounted input/output cable port assembly, depending upon the cable routing requirements for a particular rack or data center implementation. By way of specific example, a top-mounted input/output cable port assembly such as described below may be employed with a System p® or System z® electronics rack, offered by International Business Machines Corporation of Armonk, N.Y.

As described above, there are typically a large number of copper-based input/output cables exiting an electronics rack. In one desired implementation, at least a portion of these cables may exit the rack at the rack's top, for example, into an overhead cable trough or ceiling space. In such an implementation, the input/output cables could inadvertently function as broadcasting antennae extending upwards from the electronics rack. To address this issue, described below with reference to FIGS. 7A-10D, is a top-mounted input/output cable port assembly which functions to attenuate electromagnetic interference resulting from transient or steady state current on the input/output cables of the electronics rack passing therethrough before the cables exit the top of the rack.

FIG. 7A depicts one embodiment of an electronics rack 700 residing on a non-raised floor 701 of a data center, and comprising a bottom-mounted input/output cable port assembly 710 (e.g., such as described above in connection with FIG. 3 or FIGS. 4-6B), through which one or more cables 711 (such as power line cords) pass. In addition, electronics rack 700 includes a top-mounted input/output cable port assembly 720, in accordance with an aspect of the present invention. This top-mounted cable port assembly 720 is shown residing partially over a top of electronics rack 700, and partially over a frame extender 730 mounted to one side of electronics rack 700 to, for example, facilitate running of input/output cables of the electronics rack between top-mounted input/output cable port assembly 720 and one or more electronics drawers (or components) within the electronics rack. As explained further below, the top-mounted input/output cable port assembly may comprise part of or couple to the frame extender to facilitate mounting of the assembly to the electronics rack and running of the input/output cables. The top-mounted input/output cable port assembly 720 is configured to facilitate exiting of input/output cables 721 from the rack in a manner to extend upwards from the top of the electronics rack to, for example, an overhead cable trough or drop ceiling (not shown).

FIG. 7B depicts an alternate implementation of a raised floor data center comprising multiple electronics racks 700 residing on a raised floor 740, spaced from a base (or sub-floor) 750 and defining a space (or plenum) 745 through which, for example, power line cords 711 and input/output cables 712 of electronics rack 700 may pass from a bottom-mounted input/output cable port assembly 710, such as described above. In this embodiment, each electronics rack 700 also includes a top-mounted input/output cable port assembly 720 which facilitates exiting of further input/output cables 721 of the racks in an upwards direction at the top of the respective electronics racks. In one implementation, one electronics rack 700 might comprise a central electronics complex (CEC), such as offered by International Business Machines Corporation, comprising a rack housing CPUs, RAM, PCI backplane, etc., linked together with other central electronics complex racks by, for example, scalability cables, while the other electronics rack 700 illustrated in FIG. 7B might comprise a power input/output rack, which includes power management for the central electronics complex rack(s) within the data center.

Figure 8:
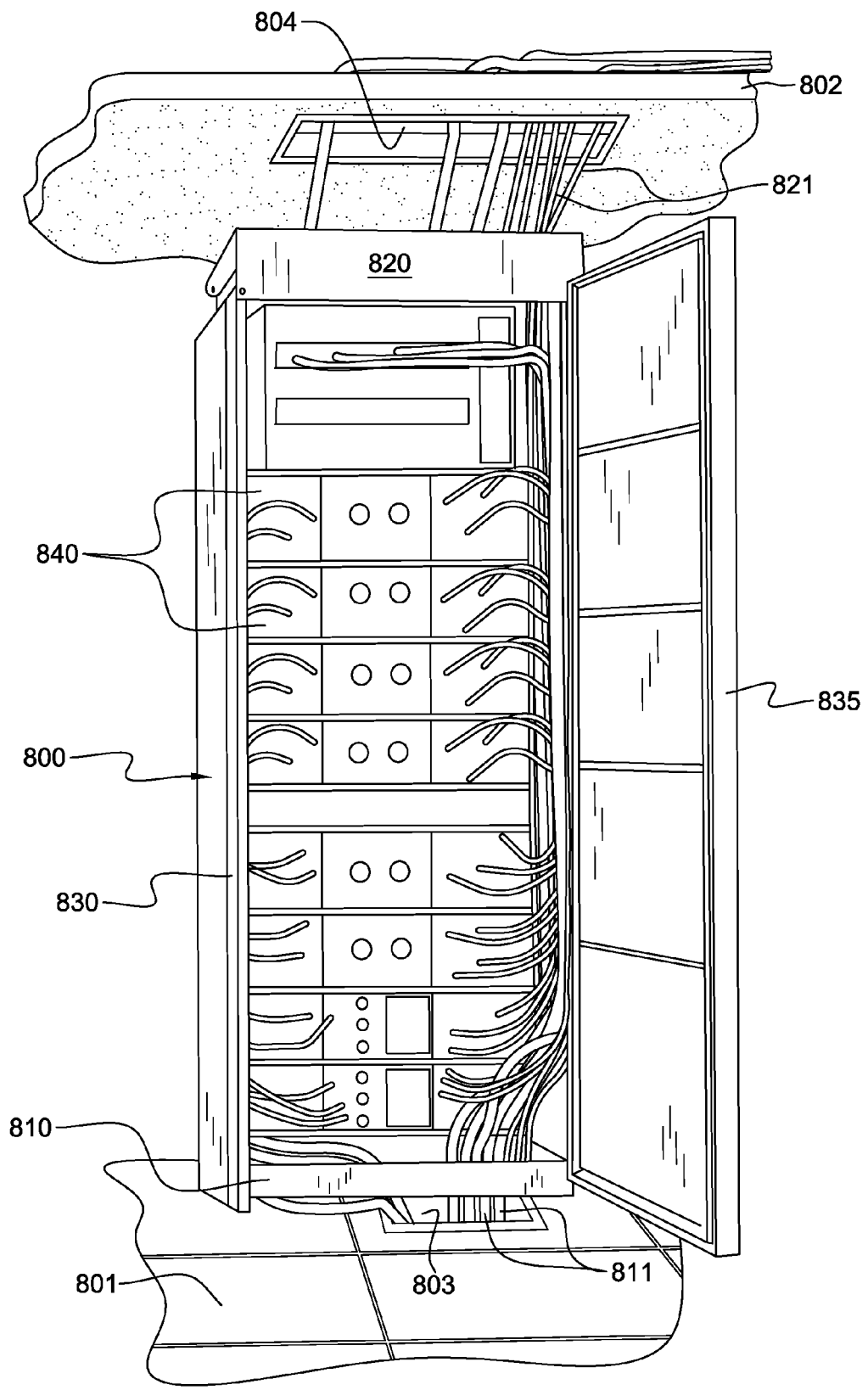
FIG. 8 is a perspective view of one embodiment of an electronics rack with a top-mounted input/output cable port assembly and a bottom-mounted input/output cable port assembly, in accordance with an aspect of the present invention.

FIG. 8 is a perspective view of one detailed embodiment of an electronics rack 800 residing on a raised floor 801 within a data center comprising a drop ceiling 802 with cable routing being provided both below raised floor 801 and above drop ceiling 802. As illustrated, electronics rack 800 includes a bottom-mounted input/output cable port assembly 810 and a top-mounted input/output cable port assembly 820, through which cables 811 and 821, respectively, pass. In one embodiment, bottom-mounted input/output cable port assembly 810 is either a tailgate assembly such as described above in connection with FIG. 3, or an input/output cable port assembly such as described above in connection with FIGS. 4-6B, while top-mounted input/output cable port assembly 820 may be implemented as described below.

In the illustrated embodiment, a frame extender 830 is provided attached to, for example, one side of electronics rack 800, with electronics rack door 835 coupled thereto shown pivoted open to access, for example, electronics drawers 840 of electronics rack 800. Frame extender 830 advantageously facilitates routing of input/output cables, either upwards through top-mounted input/output cable port assembly 820, or downwards through bottom-mounted input/output cable port assembly 810. In one implementation, cables 811 might comprise power line cords passing through an opening 803 in raised floor 801 of the data center, while cables 821 might comprise input/output cables, such as Ethernet cables, exiting from the electronics rack through the top-mounted input/output cable port assembly and passing through an opening 804 in drop ceiling 802 of the data center.

Figure 9A:
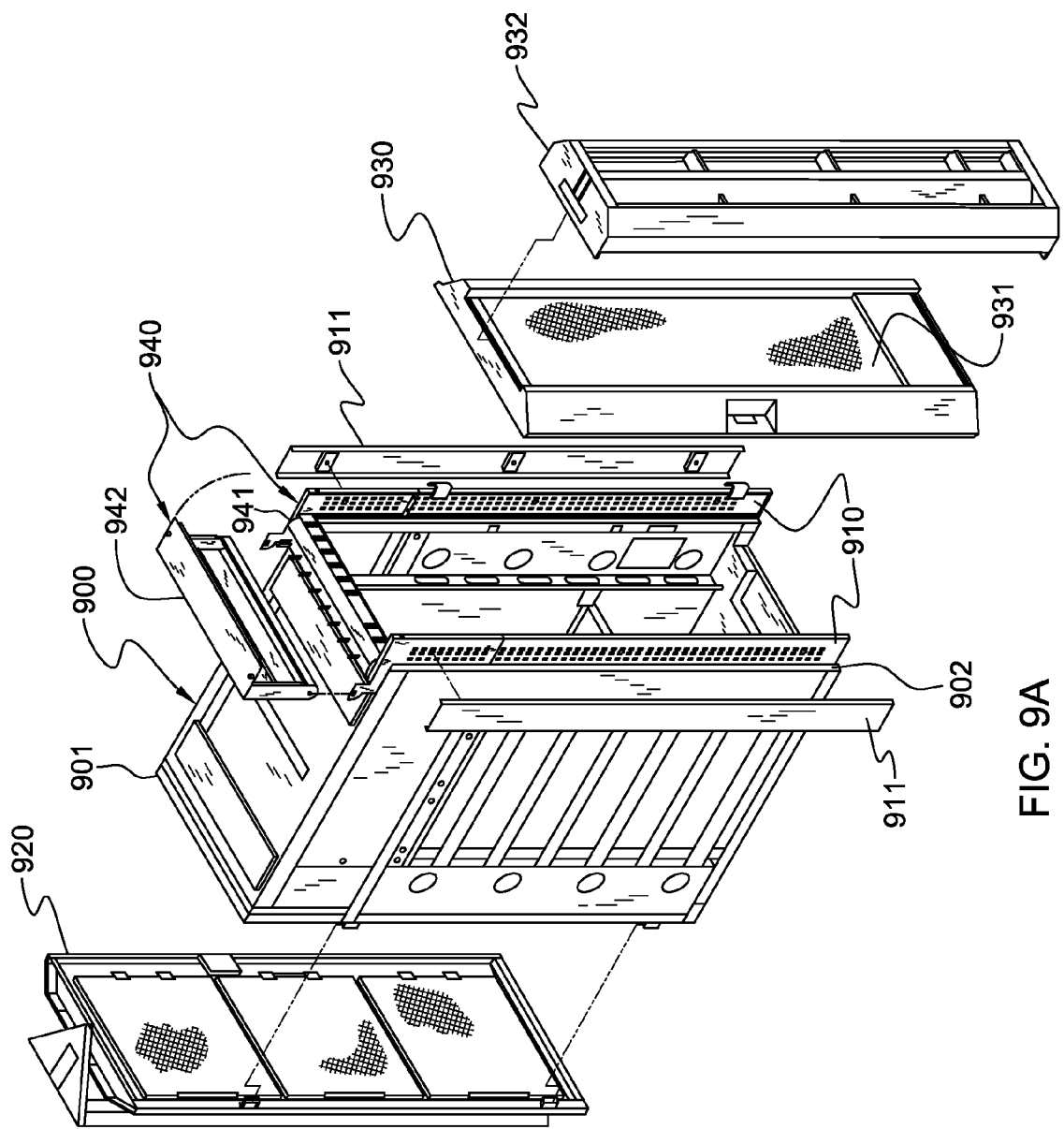
FIG. 9A is a partially exploded view of a partially-assembled electronics rack employing a top-mounted input/output cable port assembly, in accordance with an aspect of the present invention.

By way of further detail, FIG. 9A depicts a partially exploded view of a partially-assembled electronics rack 900 having a first side 901 and a second side 902. As illustrated, frame extenders 910 are shown coupled to second side 902 of electronics rack 900 with cover plates 911 shown sized to reside over frame extenders 910. A first door 920, for example, an air inlet side door, mounts to side 901 of electronics rack 900, while a second door 930, for example, an air outlet side door, mounts to second side 902 of electronics rack 900. Doors 920, 930 are configured to allow air to flow through the electronics rack to facilitate cooling of the electronic components within the rack. In the embodiment of FIG. 9A, door 930 is shown to include an opening 931 with an airflow director 932 configured to mount over opening 931. Each door 920, 930 is configured to hingedly mount to a respective edge of electronics rack 900. Alternatively, door 930 may be configured to mount to one of the frame extenders 910 of electronics rack 900. In one embodiment, frame extenders 910 are provided to facilitate routing of cables, such as input/output cables or power line cords, to the respective electronic components (not shown) within the electronics rack. Those skilled in the art will note that, alternatively, the length of electronics rack 900 may be extended to accommodate routing of cables in a manner similar to that disclosed herein with respect to frame extenders 910. Also, if desired, frame extenders 910 could be disposed on first side 901 of electronics rack 900, to, for example, facilitate further routing of cables, such as input/output cables or power line cords, of the electronics rack.

Figure 9B:
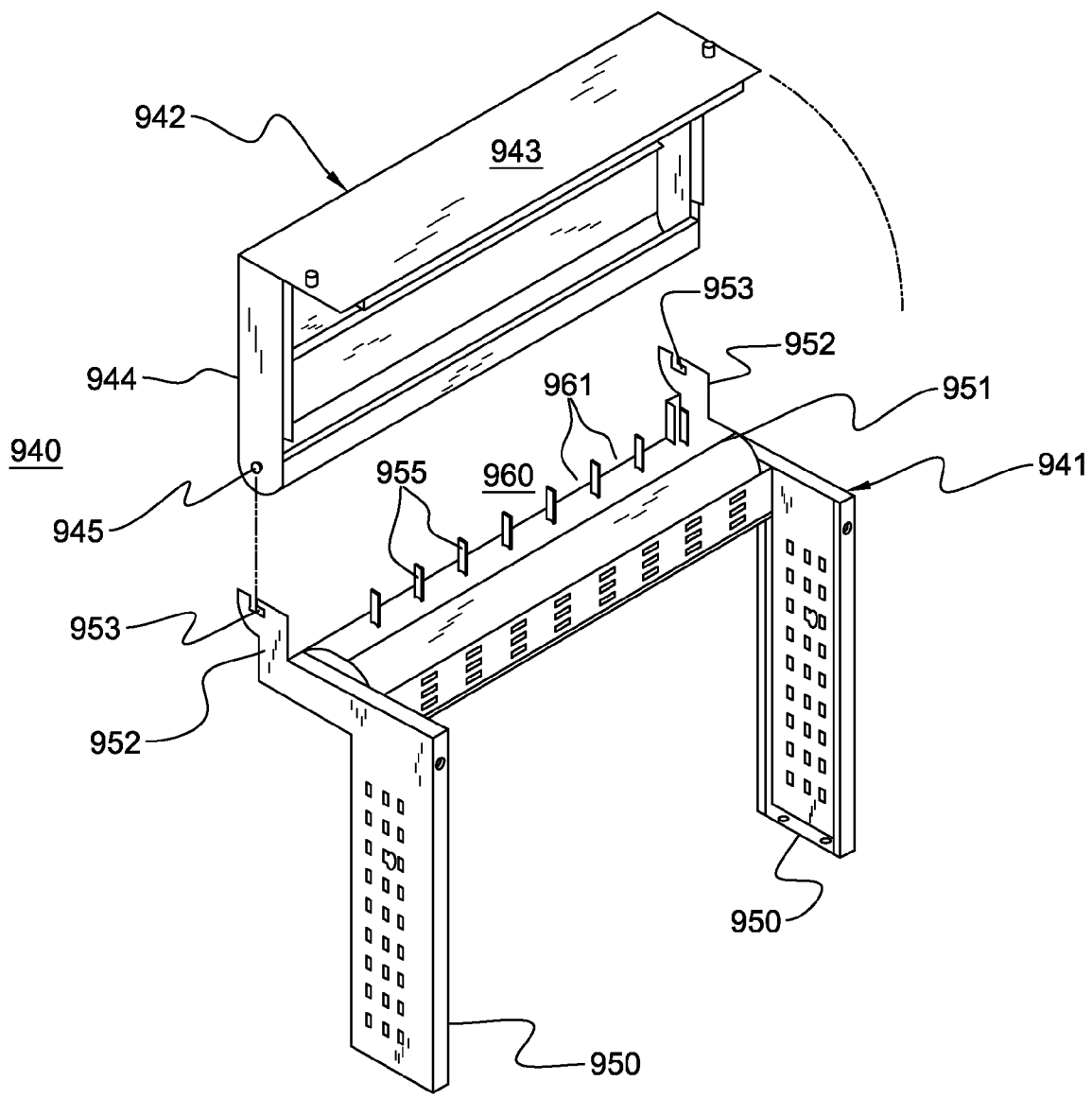
FIG. 9B is a perspective view of one embodiment of the cable port structure of the top-mounted input/output cable port assembly of FIG. 9A, in accordance with an aspect of the present invention.

FIGS. 9A & 9B illustrate one embodiment of a cable port structure 940 of a top-mounted input/output cable port assembly, in accordance with an aspect of the present invention. As illustrated, cable port structure 940 includes an inverted L-shaped structure 941, configured to mount to a top of the electronics rack and to an upper portion of second edge 902 of electronics rack 900, and a cover 942, configured to hingedly mount to inverted L-shaped structure 941.

Referring to FIG. 9B, inverted L-shaped structure 941 is shown to include depending frame extender portions 950, which are configured and spaced to mount to, for example, second edge 902 of electronics rack 900, and a top base portion 951 which resides, in one example, over the top of electronics rack 900. Top base portion 951 includes two opposing, upward-projecting arms 952, which comprise slots (or openings) 953 sized to receive hinge pins 945 of cover 942. Through sizing of opposing, upwards-projecting arms 952 and placement of slots 953, an opening 960 is defined for input/output cables (not shown) of the electronics rack to pass. This opening 960 is further divided into sub-openings 961 by multiple partitions 955 extending upwards from top base portion 951 of inverted L-shaped structure 941. As illustrated, cover 942 includes, in one example, a top surface 944 and a front surface 943, sized to engage depending frame extender portions 950 when cover 942 of the cable port structure is closed against inverted L-shaped structure 941. When cover 942 is closed, partitions 955, which in one embodiment, are evenly spaced vertical metal posts, function to break up the elongate opening 960 into smaller sub-openings 961 to, for example, further attenuate electromagnetic interference emissions from the electronics rack.

Further electromagnetic interference control is attained by the use of ferrite inductors within the top-mounted input/output cable port assembly. One embodiment of the resultant assembly is depicted in FIGS. 10A-10D. This top-mounted input/output cable port assembly advantageously incorporates ferrite inductors through which input/output cables of the electronics rack pass when exiting the rack at the top of the rack, for example, to extend upwards to a space above the rack. Advantageously, incorporation of ferrite inductors into a top-mounted input/output cable port assembly such as depicted in FIGS. 10A-10D, removes the need to customize individual input/output cables, and thus conserves engineering and inventory expenses which would otherwise be needed to manage the large number of cable parts with incorporated RF chokes that would be required.

Referring collectively to FIGS. 10A-10D, an electronics rack 1000 is illustrated comprising a top 1001 and a side edge 1002. A frame extender 1005 is illustrated mounted to side edge 1002 of electronics rack 1000, such as described above in connection with FIGS. 7A-9A, for (for example) facilitating routing of input/output cables 1010. One embodiment of a top-mounted input/output cable port assembly 1020 is shown for accommodating input/output cables 1010, such as input/output signal or communication cables. In the embodiment illustrated, cables 1010 reside within the portion of the frame assembly defined by frame extender 1005 attached to frame edge 1002 of electronics frame 1000. Although not illustrated, top-mounted input/output cable port assembly 1020 might include the inverted L-shaped structure 941 of FIGS. 9A & 9B, with a cover 1021 pivotally mounted 1023 thereto such than an opening 1030 is defined within the cable port structure that allows passage of input/output cables 1010, which in one embodiment, extend upwards from the top 1001 of electronics rack 1000.

A plurality of partitions 1031 extend upwards from the top base portion of the cable port structure to divide opening 1030 into multiple sub-openings. Within each sub-opening, a bin 1050 is provided for holding (in the embodiment illustrated) multiple ferrite inductors 1041. Each ferrite inductor 1041 includes a bottom ferrite inductor portion 1041 and a top ferrite inductor portion 1042, with opposing first and second surfaces, respectively, that define a central opening 1043 through which one or more input/output cables 1010 pass. In one embodiment, bin 1050 might comprise a U-shaped bin structure sized to accommodate multiple ferrite inductors 1040, with three ferrite inductors 1040 being illustrated in the figures (by way of example only) within each bin 1050. Bins 1050 are sized to reside within the sub-openings defined between partitions 1031.

Advantageously, by sizing each bin 1050 to accommodate multiple ferrite inductors 1040, the multiple ferrite inductors within a given bin may be constructed with different permeability values to attenuate electromagnetic interference of different ranges of frequency. For example, in the three ferrite inductor per bin embodiment illustrated in FIGS. 10A-10D, a first ferrite inductor within a given bin could attenuate electromagnetic interference of a low frequency range, a second ferrite inductor within the given bin could attenuate electromagnetic interference of a middle range of frequencies, and a third ferrite inductor within the given bin could attenuate electromagnetic interference of a high frequency range. Bins 1050 further include side wall spacers 1051 positioned and sized with reference to the ferrite inductors and the size of the bins to achieve a desired spacing between the multiple ferrite inductors within a given bin.

As briefly noted, each ferrite inductor is defined (in one embodiment) by a stacked pair of ferrite inductor portions comprising a bottom ferrite inductor portion 1041 and a top ferrite inductor portion 1042. These ferrite inductor portions comprise a first surface and a second surface, respectively, wherein the first surface and the second surface are in opposing relation when the top ferrite inductor portion is stacked over the bottom ferrite inductor portion. The first and second surfaces are configured to define the central opening therebetween for one or more input/output cables of the electronics rack to pass therethrough. By way of example, the first surface might comprise a first concave surface and the second surface a second concave surface. Alternatively, the first surface might comprise a U-shaped surface and the second surface a planar surface or a second U-shaped surface. Other configurations may be devised by those skilled in the art and are considered to be encompassed by the claims presented herein.

Figure 10A:
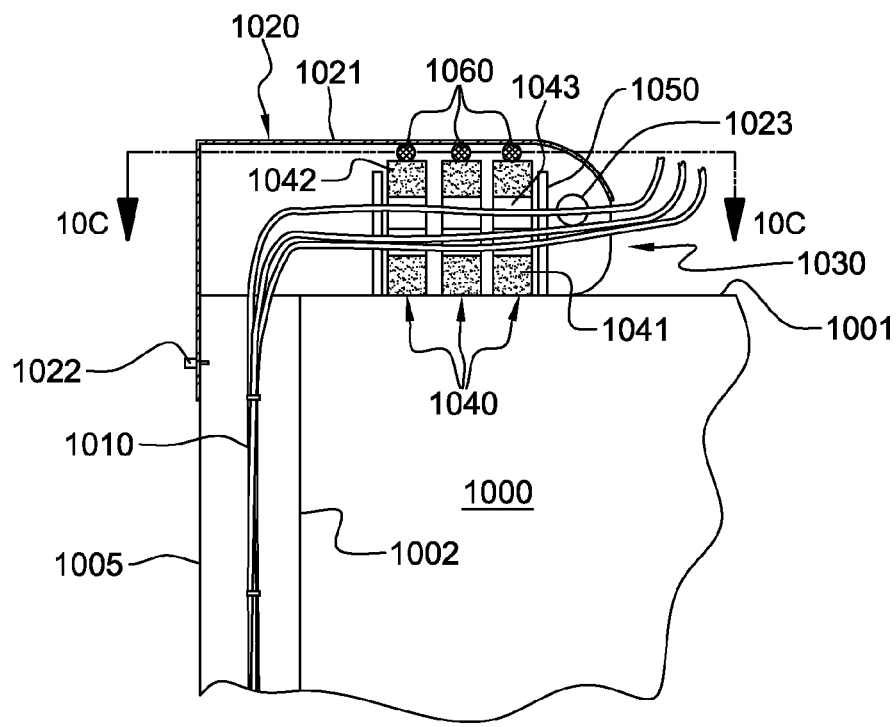
FIG. 10A is a partial cross-sectional side elevational view of one embodiment of an electronics rack with a top-mounted input/output cable port assembly, taken along line 10A-10A in the plan view of FIG. 10C, in accordance with an aspect of the present invention.
Figure 10B:
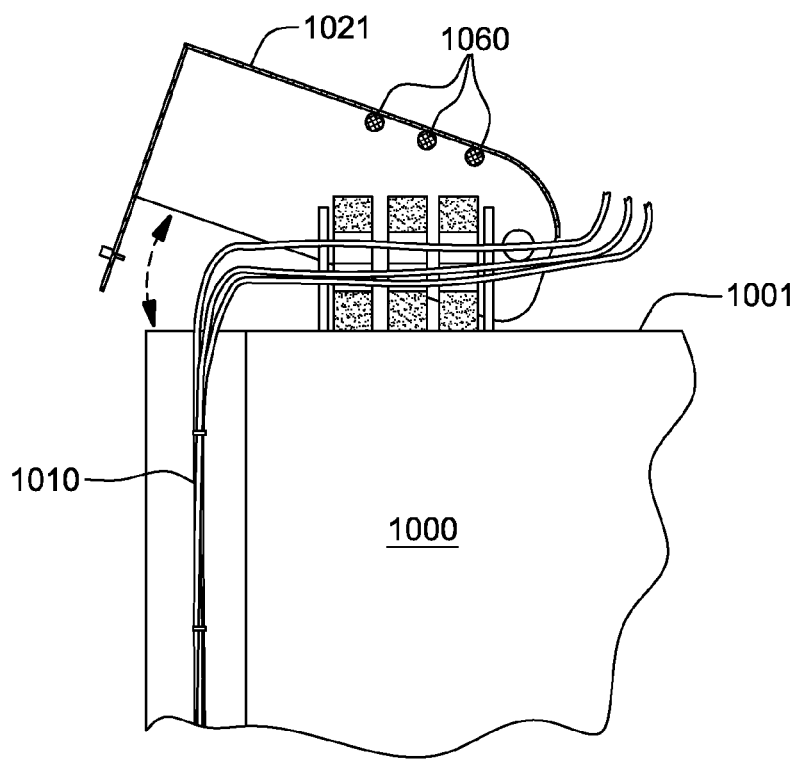
FIG. 10B depicts the partial cross-sectional side elevational view of the electronics rack and top-mounted input/output cable port assembly of FIG. 10A, with the cover of the input/output cable port assembly shown pivoted partially upwards for, for example, access to the ferrite inductors of the input/output cable port assembly, in accordance with an aspect of the present invention.
Figure 10C:
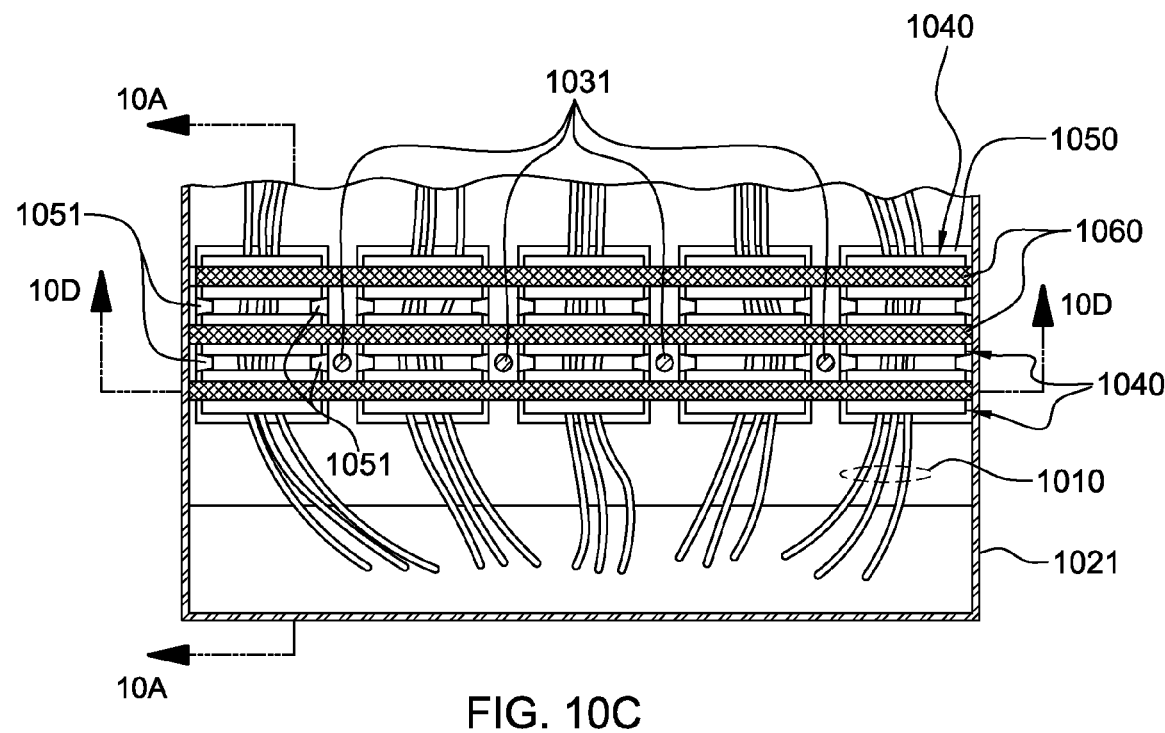
FIG. 10C is a plan view of the electronics rack with top-mounted input/output cable port assembly of FIG. 10A, taken along line 10C-10C thereof, in accordance with an aspect of the present invention.
Figure 10D:
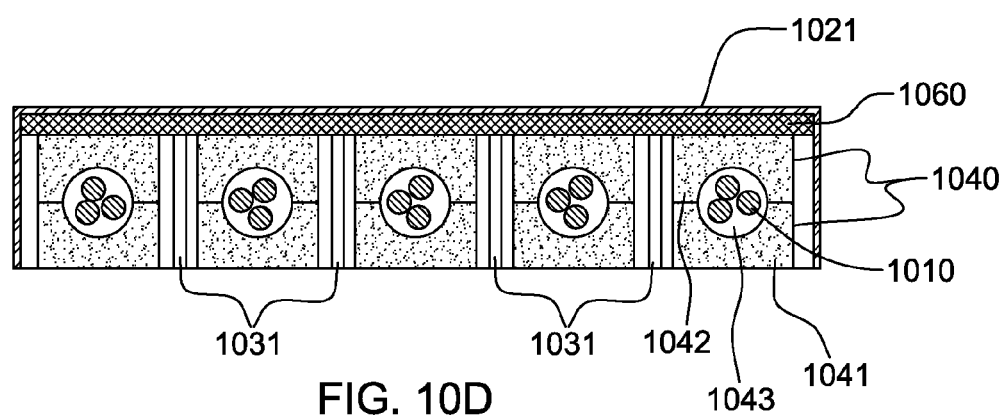
FIG. 10D is a cross-sectional elevational view of the top-mounted input/output cable port assembly of FIG. 10C, taken along line 10D-10D thereof, in accordance with an aspect of the present invention.

FIGS. 10A & 10B depict cover 1021 in closed position and in partially opened position, respectively. Cover 1021 pivots via hinge 1023 (such as described above in connection with FIG. 9B). In the embodiment illustrated, cover 1021 includes a plurality of compressible structures (e.g., elastomer gaskets or strips) 1060 affixed to the underside of the cover and positioned to engage the top ferrite inductor portions of the ferrite inductors within the bins when the cover is closed. Proper positioning of the cover relative to the electronics rack is ensured via one or more cover screws 1022, which align to an outer edge of the inverted L-shaped structure of the cable port structure illustrated in FIG. 9B. In FIGS. 10C & 10D, compressible elastomer structures 1060 are shown to comprise elongate strips or layers extending the full width of the cover. These compressible structures are sized, along with the bottom ferrite inductor portions, and top ferrite inductor portions, such that the compressible structures apply force to the top ferrite inductor portions when the cover is closed to ensure that the top ferrite inductor portions and the bottom ferrite inductor portions physically contact and define the respective ferrite inductors with the central openings through which the input/output cables pass.

A method of attenuating electromagnetic interference resulting from transient or steady state currents on input/output cables exiting the top of an electronics rack is provided herein employing the top-mounted input/output cable port assembly of FIGS. 10A-10D. This method includes mounting the cable port structure, comprising (for example) an inverted L-shaped structure and a cover (such as depicted in FIG. 9B) to the top of the electronics rack, wherein the cable port structure includes an opening for input/output cables to pass therethrough. One or more bottom ferrite inductor portions are then provided, for example, within respective bins disposed within the opening of the cable port structure, with each bottom ferrite inductor portion including a first surface. One or more input/output cables are then disposed over the first surface(s) of the ferrite inductor portion(s) within the bin(s). One or more respective top ferrite inductor portions are subsequently disposed over the bottom ferrite inductor portions within the bins. The result is a stacked pair(s) of bottom and top ferrite inductor portions, which together define a ferrite inductor with a central opening defined by opposing first and second surfaces of the bottom and top ferrite inductor portions, respectively. The central opening(s) is sized to accommodate one or more input/output cables passing therethrough. Thus, one or more ferrite inductors are provided within the bin(s) to attenuate electromagnetic interference resulting from transient or steady state current on the input/output cables passing therethrough and exiting out the top of the electronics rack. The compressible structures disposed on the inner surface of the cover are sized to apply force to the top ferrite inductor portion(s) when the cover is closed and secured in closed position such that the top and bottom ferrite inductor portions physically contact.

Advantageously, a top-mounted input/output cable port assembly is disclosed wherein ferrite inductors may be combined and employed in different combinations to attenuate one or more ranges of electromagnetic interference resulting from transient or steady state current on one or more input/output cables passing therethrough. For example, two or more of the ferrite inductors within a respective bin may be constructed to attenuate electromagnetic interference of different ranges of frequency. (Such as one to attenuate a low range of frequencies, and one to attenuate a higher range of frequencies.) Further, different input/output cables may be readily routed through different configurations of ferrite inductors, depending (for example) upon the type of input/output cable and the desired range(s) of frequency attenuation.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An input/output cable port assembly for an electronics rack comprising:
    a cable port structure mounted to the electronics rack, the cable port structure having an opening for input/output cables of the electronics rack to pass therethrough;
    multiple bottom ferrite inductor portions disposed within the opening of the cable port structure, each comprising a first surface;
    multiple ferrite inductor portions disposed within the opening of the cable port structure, each comprising a second surface; and
    wherein stacked pairs of bottom and top ferrite inductor portions with first and second surfaces in opposing relation define respective ferrite inductors, each ferrite inductor comprising a central opening defined by the opposing first and second surfaces, the central opening being sized for at least one input/output cable of the electronics rack to pass therethrough, wherein at least two ferrite inductors of the multiple ferrite inductors are constructed to attenuate electromagnetic interference of different ranges of frequency.

2. The input/output cable port assembly of claim 1, wherein the cable port structure further comprises a cover, with at least one compressible structure disposed on an inner surface thereof, and wherein the multiple bottom ferrite inductor portions, the multiple top ferrite inductor portions, and the at least one compressible structure are sized and disposed so that when the cover of the cable port structure is closed the compressible structure applies force to the multiple top ferrite inductor portions to ensure that the multiple top ferrite inductor portions and the multiple bottom ferrite inductor portions physically contact and define the multiple ferrite inductors with the central opening through which the at least one input/output cable passes.

3. The input/output cable port assembly of claim 1, further comprising at least one bin disposed within the opening of the cable port structure and facilitating stacked alignment of the multiple bottom ferrite inductor portions and the multiple top ferrite inductor portions.

4. The input/output cable port assembly of claim 3, wherein the cable port structure further comprises at least one partition extending into the opening and dividing the opening into multiple sub-openings, and wherein the input/output cable port assembly further comprises multiple bins, each bin being disposed within a respective sub-opening of the multiple sub-openings in the cable port structure, and wherein each bin accommodates in stacked relation at least one bottom ferrite inductor portion of the multiple bottom ferrite inductor portions, and at least one top ferrite inductor portion of the multiple top ferrite inductor portions, therein to define at least one ferrite inductor.

5. The input/output cable port assembly of claim 4, wherein each bin accommodates in stacked pairs at least two bottom ferrite inductor portions and at least two top ferrite inductor portions defining at least two ferrite inductors within each bin, each stacked pair comprising a bottom ferrite inductor portion of the multiple bottom ferrite inductor portions and a top ferrite inductor portion of the multiple top ferrite inductor portions with the first and second surfaces thereof in opposing relation, wherein the multiple ferrite inductors within at least one bin of the multiple bins attenuate electromagnetic interference of different ranges of frequency.

6. The input/output cable port assembly of claim 1, wherein the cable port structure is mounted to an upper portion of the electronics rack and the input/output cables of the electronics rack passing therethrough, upon exiting the input/output cable port assembly, extend upwards from the top of the electronics rack.

7. The input/output cable port assembly of claim 6, further in combination with a bottom-mounted input/output cable port assembly coupled to the electronics rack with an opening for one or more rack cables to pass therethrough, wherein at least one cable of the electronics rack extends through the input/output cable port assembly upwards from the top of the electronics rack and at least one cable of the electronics rack extends downwards from the electronics rack through the bottom-mounted input/output cable port assembly.

8. The input/output cable port assembly of claim 6, further comprising a frame extender mounted to a side of the electronics rack to facilitate running of input/output cables of the electronics rack between the input/output cable port assembly and one or more components within the electronics rack, and wherein the cable port structure is mounted to the frame extender and extends partially over the top of the electronics rack.

9. An electronics system comprising:
    an electronics rack, the electronics rack comprising:
        a rack frame;
        at least one electronics subsystem disposed within the electronics rack and supported by the rack frame; and
        an input/output cable port assembly mounted to the electronics rack through which at least a portion of the input/output cables of the electronics rack pass, the input/output cable port assembly comprising:
            a cable port structure mounted to an upper portion of the rack frame, the cable port structure having an opening for input/output cables of the electronics rack to pass therethrough;
            at least one bottom ferrite inductor portion disposed within the opening of the cable port structure, and comprising a first surface;

at least one top ferrite inductor portion disposed within the opening of the cable port structure, and comprising a second surface; and wherein the at least one bottom ferrite inductor portion and the at least one top ferrite inductor portion are stacked within the cable port structure with the first surface and the second surface thereof in opposing relation to define at least one ferrite inductor, each ferrite inductor comprising a central opening defined by the opposing first and second surfaces, the central opening being sized for at least one input/output cable of the electronics rack to pass therethrough, wherein the at least one ferrite inductor attenuates electromagnetic interference resulting from transient or steady state current on the at least input/output cable passing therethrough.

10. The electronics system of claim 9, wherein the input/output cable port assembly further comprises multiple bottom ferrite inductor portions disposed within the opening of the cable port structure, each comprising a first surface, and multiple top ferrite inductor portions disposed within the opening of the cable port structure, each comprising a second surface, wherein stacked pairs of bottom and top ferrite inductor portions with first and second surfaces in opposing relation define respective ferrite inductors, each with a central opening for at least one input/output cable of the electronics rack to pass therethrough.

11. The electronics system of claim 10, wherein at least two ferrite inductors of the multiple ferrite inductors are constructed to attenuate electromagnetic interference of different ranges of frequency.

12. The electronics system of claim 11, wherein the at least two ferrite inductors of the multiple ferrite inductors constructed to attenuate electromagnetic interference of different ranges of frequency are disposed in series within the opening of the cable port structure so that an input/output cable of the electronics rack passes through each central opening thereof.

13. The electronics system of claim 11, wherein the at least two ferrite inductors of the multiple ferrite inductors constructed to attenuate electromagnetic interference of different ranges of frequency are disposed in parallel within the opening of the cable port structure so that different input/output cables of the electronics rack pass through the central openings thereof.

14. The electronics system of claim 9, wherein the cable port structure further comprises a cover, with at least one compressible structure disposed on an inner surface thereof, and wherein the at least one bottom ferrite inductor portion, the at least one top ferrite inductor portion, and the at least one compressible structure are sized and disposed so that when the cover of the cable port structure is closed, the compressible structure applies force to the at least one top ferrite inductor portion to ensure that the at least one top ferrite inductor portion and the at least one bottom ferrite inductor portion physical contact and define at least one ferrite inductor with the central opening through which the at least one input/output cable passes, and wherein the input/output cable port assembly further comprises at least one bin disposed within the opening of the cable port structure facilitating stacked alignment of the at least one bottom ferrite inductor portion and the at least one top ferrite inductor portion.

15. The electronics system of claim 14, wherein the cable port structure further comprises at least one partition extending into the opening and dividing the opening into multiple sub-openings, and wherein the input/output cable port assembly further comprises multiple bins, a plurality of bottom ferrite inductor portions and a plurality of top ferrite inductor portions, each bin being disposed within a respective sub-opening of the multiple sub-openings in the cable port structure, and wherein each bin accommodates in stacked relation at least one bottom ferrite inductor portion and at least one top ferrite inductor portion therein to define at least one ferrite inductor.

16. The electronics system of claim 15, wherein each bin accommodates in stacked pairs multiple bottom and top ferrite inductor portions, each stacked pair comprising a bottom ferrite inductor portion of the multiple bottom ferrite inductor portions and a top ferrite inductor portion of the multiple top ferrite inductor portions with the first and second surfaces thereof in opposing relation, and wherein the multiple ferrite inductors within at least one bin of the multiple bins attenuate electromagnetic interference of different ranges of frequency.

17. A method of attenuating electromagnetic interference resulting from transient or steady state current on at least one input/output cable exiting an electronics rack, the method comprising:

mounting a cable port structure to the electronics rack, the cable port structure comprising an opening for input/output cables to pass therethrough;

providing at least one bottom ferrite inductor portion within the opening of the cable port structure, the at least one bottom ferrite inductor portion comprising a first surface;

disposing the at least one input/output cable over the first surface of the at least one bottom ferrite inductor portion;

positioning at least one top ferrite inductor portion over the at least one bottom ferrite inductor portion within the opening of the cable port structure, the at least one top ferrite inductor portion comprising a second surface, and the positioning comprising disposing the at least one top ferrite inductor portion over the at least one bottom ferrite inductor portion with the first and second surfaces thereof in opposing relation to define at least one ferrite inductor, each with a central opening defined by the opposing first and second surfaces, the central opening being sized for at least one input/output cable to pass therethrough, wherein the at least one ferrite inductor attenuates electromagnetic interference resulting from transient or steady state current on the at least one input/output cable passing therethrough; and wherein the cable port structure further comprises at least one partition extending into the opening and dividing the opening into multiple sub-openings, and wherein the providing comprises providing a plurality of bottom ferrite inductor portions, and the positioning comprises positioning a plurality of top ferrite inductor portions over the plurality of bottom ferrite inductor portions, and wherein the method further comprises providing multiple bins, each bin being disposed within a respective sub-opening of the multiple sub-openings in the cable port structure, and wherein each bin accommodates in stacked relation at least one bottom ferrite inductor portion and at least one top ferrite inductor portion therein to define at least one ferrite inductor.

18. The method of claim 17, wherein at least two ferrite inductors within the multiple bins are constructed to attenuate electromagnetic interference of different ranges of frequency.

* * * * *